(12) United States Patent
Liao et al.

(10) Patent No.: US 6,689,636 B2
(45) Date of Patent: Feb. 10, 2004

(54) SEMICONDUCTOR DEVICE AND FABRICATION METHOD OF THE SAME

(75) Inventors: Chih-Chin Liao, Changhua (TW); Han-PIng Pu, Taipei (TW); Chien-Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/411,457

(22) Filed: Apr. 10, 2003

(65) Prior Publication Data
US 2003/0173680 A1 Sep. 18, 2003

Related U.S. Application Data

(62) Division of application No. 10/060,811, filed on Jan. 30, 2002, now Pat. No. 6,570,249.

(30) Foreign Application Priority Data

Dec. 24, 2001 (TW) .......................................... 90132013 A

(51) Int. Cl.[7] .............................................. H01L 21/44
(52) U.S. Cl. ...................... 438/107; 438/108; 438/124; 438/126; 438/127
(58) Field of Search ................................. 438/107, 108, 438/110, 111, 112, 121, 124, 125, 126, 127

(56) References Cited

U.S. PATENT DOCUMENTS

| | | |
|---|---|---|
| 5,264,730 A | 11/1993 | Matsuzaki et al. |
| 5,311,405 A | 5/1994 | Tribbey et al. |
| 5,670,824 A | 9/1997 | Weinberg |
| 5,739,581 A | 4/1998 | Chillara et al. |
| 5,796,165 A | 8/1998 | Yoshikawa et al. |
| 5,811,880 A | 9/1998 | Banerjee et al. |
| 5,825,628 A | 10/1998 | Garbelli et al. |
| 6,291,880 B1 | 9/2001 | Ogawa et al. |
| 6,316,828 B1 | 11/2001 | Tao et al. |
| 6,429,536 B1 * | 8/2002 | Liu et al. ..................... 257/786 |
| 6,570,249 B1 * | 5/2003 | Liao et al. .................. 257/724 |
| 6,573,119 B1 * | 6/2003 | Hirashima et al. ............. 438/64 |
| 6,603,154 B2 * | 8/2003 | Sakai et al. .................. 257/166 |
| 2002/0027295 A1 | 3/2002 | Kikuma et al. |

FOREIGN PATENT DOCUMENTS

| | | |
|---|---|---|
| JP | 59-136963 | 8/1984 |
| JP | 63-179764 | 7/1988 |

* cited by examiner

*Primary Examiner*—Kevin M. Picardat
(74) *Attorney, Agent, or Firm*—Peter F. Corless; Steven M. Jensen; Edwards & Angell, LLP

(57) ABSTRACT

A semiconductor device and a fabrication method of the same are proposed, in which at least one electronic component is firstly mounted on a first substrate, and then the first substrate is attached onto a semiconductor chip or a second substrate. Further, with the chip being deposited on the second substrate, electrical connection is established among the first substrate, the second substrate and the chip. This combined structure is subsequently subjected to molding, ball implantation and singulation processes, and thus completes the fabrication of the semiconductor device. Such a semiconductor device provides significant advantages, including prevention of the occurrence of wire short-circuiting, no need to alter the substrate design, no need to use a circuit pattern with fine pitches or an expensive substrate integrated with electronic components.

8 Claims, 8 Drawing Sheets

SEMICONDUCTOR DEVICE AND FABRICATION METHOD OF THE SAME

CROSS-REFERENCE TO RELATED APPLICATION(S)

This application is a divisional of application U.S. Ser. No. 10/060,811, filed on Jan. 30, 2002, now U.S. Pat. No. 6,570,249.

FIELD OF THE INVENTION

The present invention relates to semiconductor devices and fabrication methods of the same, and more particularly, to a semiconductor device incorporated with electronic components such as passive components, and a method for fabricating the semiconductor device.

BACKGROUND OF THE INVENTION

Generally, in order to desirably improve performances and functionality, semiconductor devices are often made in association with electronic components such as passive components. For example, U.S. Pat. Nos. 5,264,730, 5,311,405, 5,811,880, 5,825,628 and 6,316,828 disclose the incorporation of passive components on substrates for use in BGA (ball grid array) semiconductor packages, which passive components are purposed in enhancing overall electrical functions of the semiconductor packages.

Such a substrate with passive components being mounted thereon for use in a semiconductor device is illustrated in FIG. 9, wherein the passive components 40 such as resistors or capacitors are preferably disposed on a ground ring 13 and a power ring 12 of the substrate 10 at positions close to a chip 20 that is accommodated on the substrate 10. In particular, the passive components 40 are most preferably positioned at four corners in proximity to the chip 20, respectively.

However, as the passive components 40 occupied certain layout area on the substrate 10, pitches P between adjacent bond fingers 11 that are located between two passive components 40, are necessarily reduced from conventional dimensions of 0.150 mm to fine pitches such as 0.125 mm. This thereby significantly increases the fabrication costs.

Besides, the passive components 40 also adversely affect trace routability on the substrate 10; routing area and space for conductive traces (not shown) formed on the substrate 10 are both restricted by the arrangement of the passive components 40. On the contrary, in concern of complying with trace routability of the substrate 10, the passive components 40 must be arranged in a manner as not to interfere with the conductive traces formed on the substrate 10; this limits the number and positioning of the passive components 40 to be adopted in semiconductor devices.

Moreover, in case of the passive components 40 being disposed at peripheral positions instead of the corners nearby the chip 20 according to practical requirements, bonding wires 30 are formed to extend from the chip 20 and across the passive components 40, for electrically connecting bond pads 21 of the chip 20 to the corresponding bond fingers 11 on the substrate 10. However, as shown in FIG. 10, short circuit may easily occur as the bonding wires 30 come into contact with edges of the passive components 40, which thereby degrades the wire bonding quality and product reliability. Although this short-circuiting problem can be solved by pre-encapsulating the passive components 40 with an insulating material before forming the bonding wires 30, this pre-encapsulation process would undesirably increase complexity and costs in fabrication.

In response to the above-mentioned drawbacks, U.S. Pat. No. 5,670,824 discloses a type of substrate integrally formed with passive components, which substrate can be disposed underneath a chip for carrying the chip thereon. However, since conventional passive components such as resistors or capacitors are not suitably applied to this integration type of substrate, forming the integration substrate requires particularly designed passive components, and significantly raises the fabrication costs. Such an expensive substrate is hard to be commercialized and widely used in semiconductor industry.

Furthermore, Taiwan Patent Application No. 89121891 discloses a semiconductor structure illustrated in FIG. 11, in which a passive component 40 is directly mounted on and electrically connected to a chip 20 that is accommodated on a substrate 10. However, this semiconductor structure is rather complexly made, which needs to pre-form a plurality of connection pads 22 on the chip 20 for subsequently attaching the passive component 40 thereto. These connection pads 22 are then subjected to under bumping metalization, so as to electrically connect the connection pads 22 to solder paste that is applied for adhering the passive component 40 onto the connection pads 22. As a result, fabrication of this semiconductor structure is considerably complicated and cost-ineffective to implement.

Another embodiment of the semiconductor structure disclosed by the foregoing Taiwan patent, as shown in FIG. 12, involves the forming of conductive wires 42, 43 for electrically connecting the passive component 40 that is directly mounted on the chip 20 to a power ring 12 and a ground ring 13 on the substrate 10. However, contact terminals (not shown) formed on the passive component 40 for wire bonding use are not satisfactorily surface-flat, making a conventional wire bonding machine not able to, operate at the contact terminals for forming the conductive wires 42, 43. Moreover, if the contact terminals of the passive component 40 are not plated with gold, the wire bonding process cannot be implemented either. Therefore, since this semiconductor structure is hardly fabricated in large scale by using currently available equipment and processes, it is potentially low in demand in the market.

In accordance with the foregoing described, the present invention provides a novel, advanced and practical semiconductor device and a fabrication method thereof, so as to overcome the multiple drawbacks recited above in the prior arts.

SUMMARY OF THE INVENTION

A primary objective of the present invention is to provide a semiconductor device incorporated with electronic components such as passive components and a fabrication method of the semiconductor device, in which fine-pitch arrangement of bond fingers on a substrate needs not to be adopted.

Another objective of the invention is to provide a semiconductor device incorporated with electronic components such as passive components and a fabrication method of the semiconductor device, in which trace routability of a substrate, and number and positioning of the electronic components are not particularly limited for use in the semiconductor device.

Still another objective of the invention is to provide a semiconductor device incorporated with electronic components such as passive components and a fabrication method of the semiconductor device, which can prevent the occurrence of short circuit caused by bonding wires coming into contact with the electronic components.

A further objective of the invention is to provide a semiconductor device incorporated with electronic components such as passive components and a fabrication method of the semiconductor device, in which an expensive substrate integrated with electronic components needs not to be used, thereby making fabrication costs significantly reduced.

A further objective of the invention is to provide a semiconductor device incorporated with electronic components such as passive components and a fabrication method of the semiconductor device, in which no connection pads for mounting the electronic components thereon need to be formed on a chip, and thus no under bumping metalization for the connection pads is necessarily performed, so that fabrication processes and costs can be simplified and reduced, respectively.

A further objective of the invention is to provide a semiconductor device incorporated with electronic components such as passive components and a fabrication method of the semiconductor device, in which a conventional wire bonding machine is suitably applied for forming bonding wires, and the semiconductor device can be fabricated in a batch manner by using currently available processes and equipment.

In accordance with the above and other objectives, the present invention proposes a semiconductor device and a fabrication method of the same.

The semiconductor device of the invention comprises:

at least one electronic component having a first surface and a second surface;

a first substrate having a first surface and a second surface, wherein the second surface of the electronic component is electrically connected to the first surface of the first substrate;

a semiconductor chip having a first surface and a second surface;

a second substrate having a first surface and a second surface, wherein the second surface of the semiconductor chip is attached to the first surface of the second substrate, which combined structure of the semiconductor chip and the second substrate accommodates the first substrate that is mounted with the electronic component thereon in a manner that, for example, the second surface of the first substrate is attached to the first surface of the semiconductor chip or to the first surface of the second substrate, or to other suitable positions;

a plurality of bonding wires for establishing electrical connection among the first surface of the semiconductor chip, the first surface of the first substrate and the first surface of the second substrate;

an encapsulant formed on the first surface of the second substrate, for encapsulating the electronic component, the first substrate, the semiconductor chip and the bonding wires; and a plurality of solder balls implanted on the second surface of the second substrate.

The fabrication method of the foregoing semiconductor device of the invention comprises the steps of:

preparing a first substrate, at least one electronic component, a semiconductor chip and a second substrate, each of which has a first surface and a second surface;

electrically connecting the second surface of the electronic component to the first surface of the first substrate;

attaching the second surface of the semiconductor chip to the first surface of the second substrate;

disposing the first substrate mounted with the electronic component on combined structure of the semiconductor chip and the second substrate in a manner that, for example, the second surface of the first substrate is attached to the first surface of the semiconductor chip or to the first surface of the second substrate, or to other suitable positions;

forming a plurality of bonding wires for establishing electrical connection among the first surface of the semiconductor chip, the first surface of the first substrate and the first surface of the second substrate;

forming an encapsulant on the first surface of the second substrate, for encapsulating the electronic component, the first substrate, the semiconductor chip and the bonding wires; and implanting a plurality of solder balls on the second surface of the second substrate.

The foregoing semiconductor device and its fabrication method of the invention can also be suitably applied to a leadframe-based semiconductor device, wherein the second surface of the first substrate mounted with the electronic component thereon is attached to the first surface of the semiconductor chip.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Figure 5:
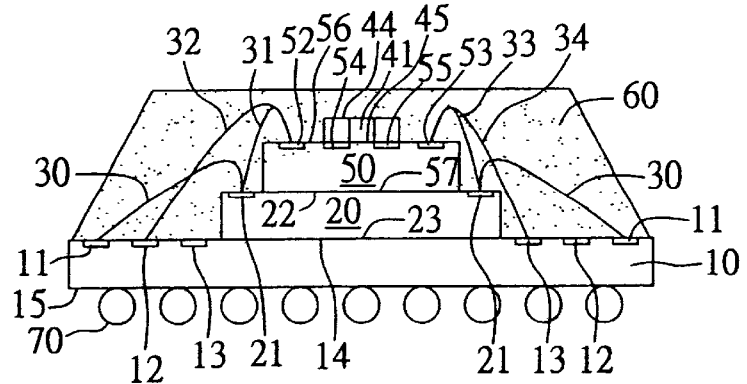
FIG. 5 is a front view of a semiconductor device formed with an encapsulant and implanted with solder balls of the invention.

As shown in FIG. 5, a semiconductor device of the present invention comprises at least one electronic component 41, a first substrate 50, a semiconductor chip 20, a second substrate 10, plural sets of bonding wires 30, 31, 32, 33, 34, an encapsulant 60, and a plurality of solder balls 70.

The electronic component 41 has a first surface 44 and an opposing second surface 45, and can be a passive component such as resistor and capacitor, or other suitable types of electronic components. The second surface 45 of the electronic component 41 is bonded to a first surface 56 of the first substrate 50 by using conventional technique such as reflow soldering, and electrically connected to a power bond pad 54 and a ground bond pad 55 formed on the first surface 56 of the first substrate 50.

The semiconductor chip 20 also has a first surface 22 and an opposing second surface 23, which second surface 23 is attached to a first surface 14 of the second substrate 10 by conventional means such as adhesion. The first substrate 50 with the electronic component 41 being carried thereon can be optionally mounted on the semiconductor chip 20 in a manner that, a second surface 57 of the first substrate 50 is adhered onto the first surface 22 of the semiconductor chip 20.

The plural sets of bonding wires 30, 31, 32, 33, 34 such as gold wires are respectively formed to establish electrical connection among the first surface 22 of the semiconductor chip 20, the first surface 56 of the first substrate 50, and the first surface 14 of the second substrate 10. In particular, as shown in FIGS. 4B and 5, the bonding wires 30 electrically connect signal pads of bond pads 21 formed on the first surface 22 of the semiconductor chip 20, to corresponding signal fingers 11 that are formed on the first surface 14 of the second substrate 10. The bonding wires 31 electrically connect power pads of the bond pads 21 on the first surface 22 of the semiconductor chip 20, to a first set of power fingers 52 that are formed on the first surface 56 of the first substrate 50 and electrically coupled to the power bond pads 54. And, the bonding wires 32 electrically connect a second set of power fingers 52 formed on the first surface 56 of the first substrate 50, to a power ring 12 formed on the first surface 14 of the second substrate 10, wherein the second set of power fingers 52 are in parallel connection with the first set of power fingers 52.

Similarly, the bonding wires 33 electrically connect ground pads of the bond pads 21 on the first surface 22 of the semiconductor chip 20, to a first set of ground fingers 53 that are formed on the first surface 56 of the first substrate 50 and electrically coupled to the ground bond pads 55. The bonding wires 34 electrically connect a second set of ground fingers 53 formed on the first surface 56 of the first substrate 50, to a ground ring 13 formed on the first surface 14 of the second substrate 10, wherein the second set of ground fingers 53 are in parallel connection with the first set of ground fingers 53.

The encapsulant 60 for protection purpose is formed on the first surface 14 of the second substrate 10, and encapsulates the electronic component 41, the first substrate 50, the semiconductor chip 20 and the bonding wires 30, 31, 32, 33, 34. The plurality of solder balls 70 are implanted on a second surface 15 of the second substrate 10, and allow the semiconductor device of the invention to be electrically connected to external devices (not shown).

Figure 8A:
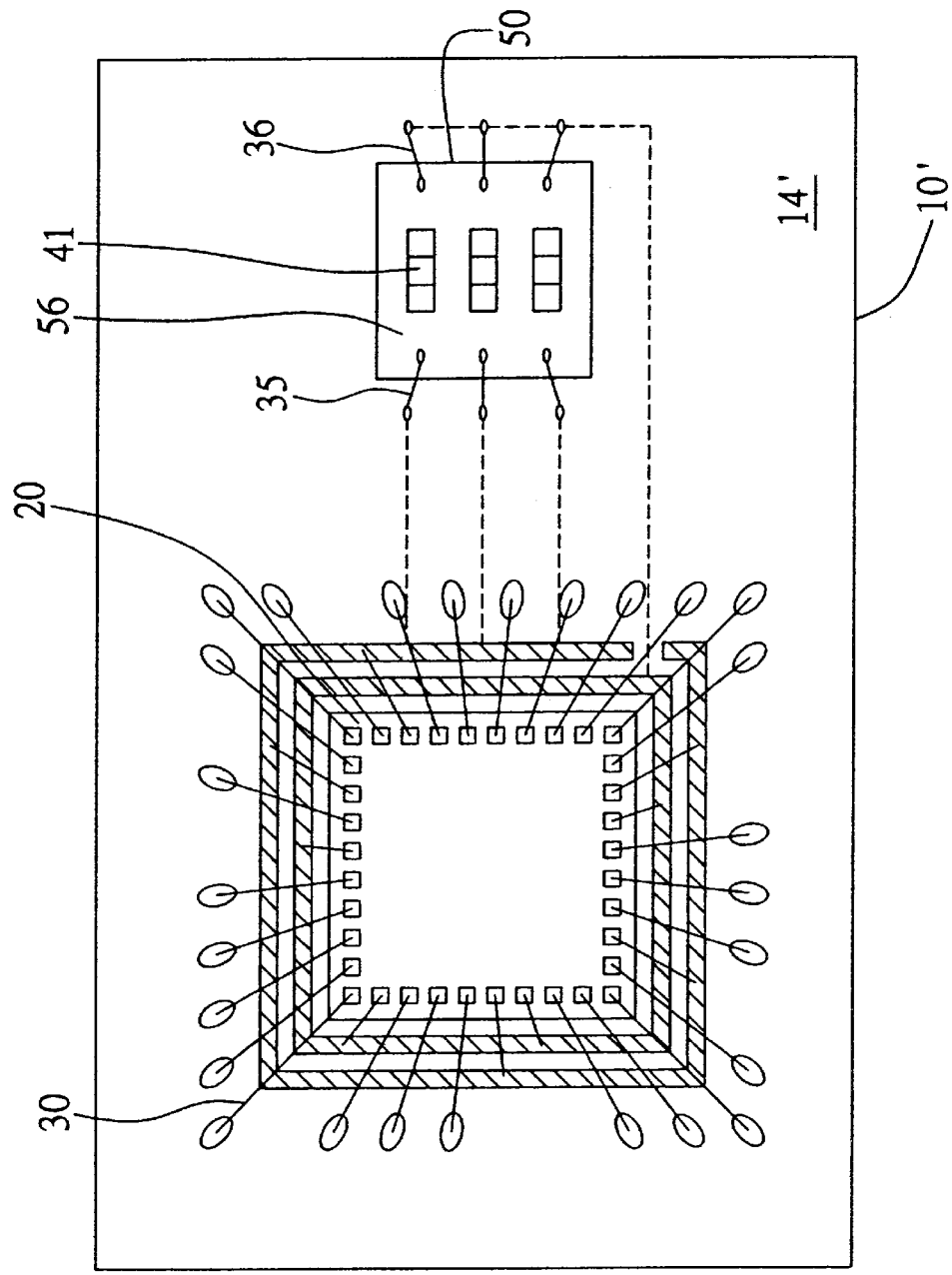
FIG. 8A is a structural top view showing a further preferred embodiment of a semiconductor structure of the invention prior to a molding process.
Figure 8B:
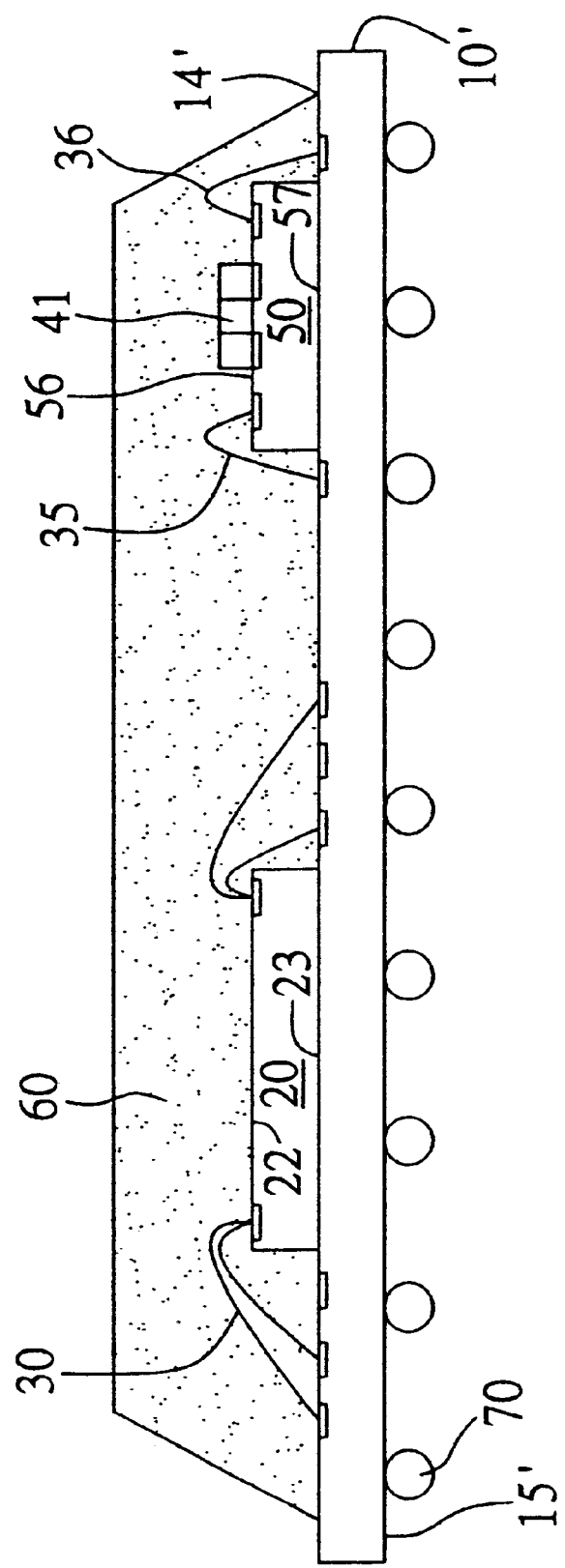
FIG. 8B is a schematic diagram showing the semiconductor structure of FIG. 8A after molding and implanted with solder balls.
Figure 9:
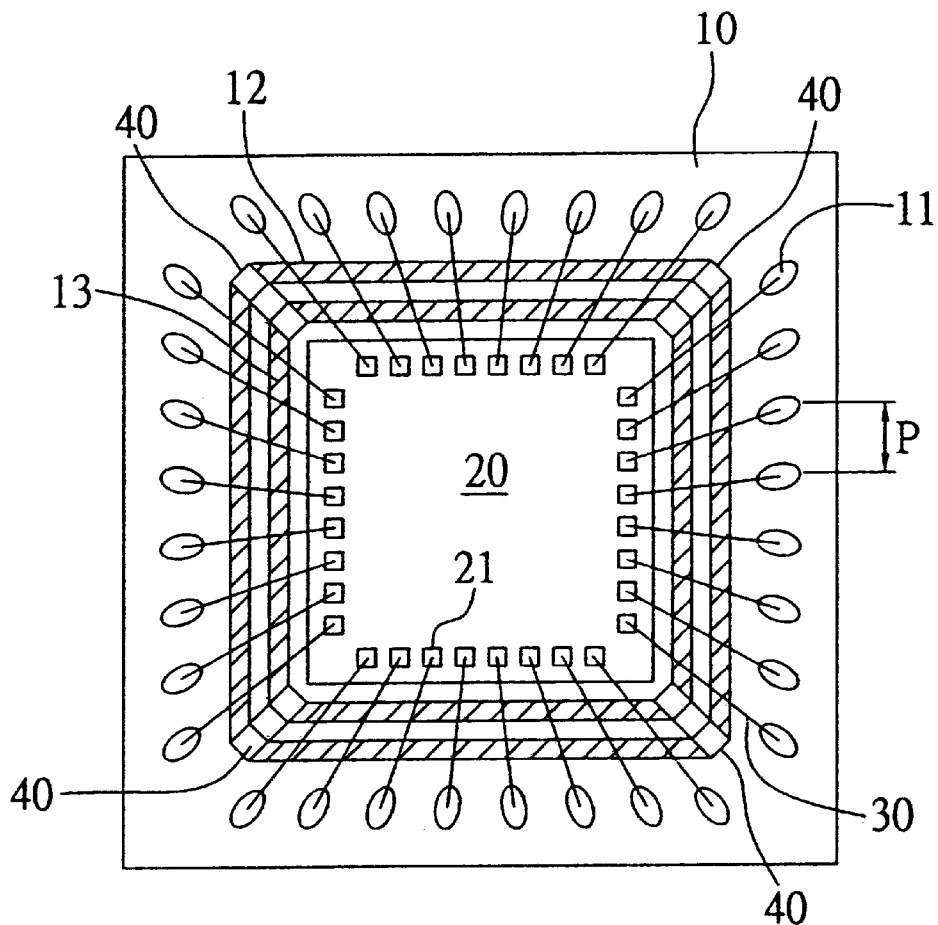
FIG. 9 (PRIOR ART) is a schematic diagram showing a conventional substrate mounted with passive components for use in a semiconductor device.
Figure 10:
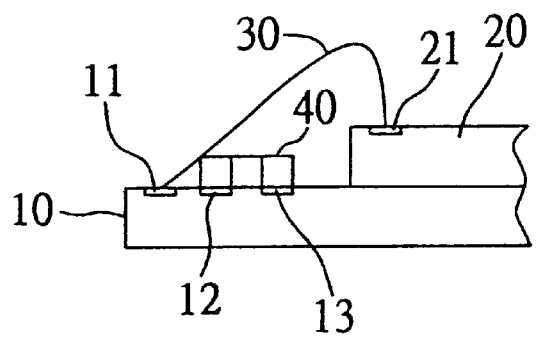
FIG. 10 (PRIOR ART) is a schematic diagram showing the occurrence of short circuit for a conventional substrate mounted with passive components for use in a semiconductor device.
Figure 11:
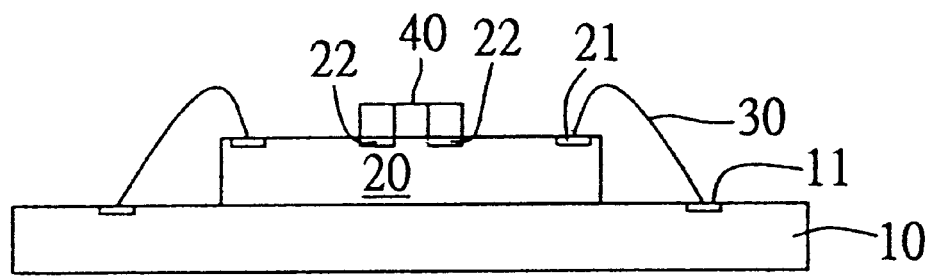
FIG. 11 (PRIOR ART) is a structural schematic diagram showing another conventional substrate mounted with passive components for use in a semiconductor device.
Figure 12:
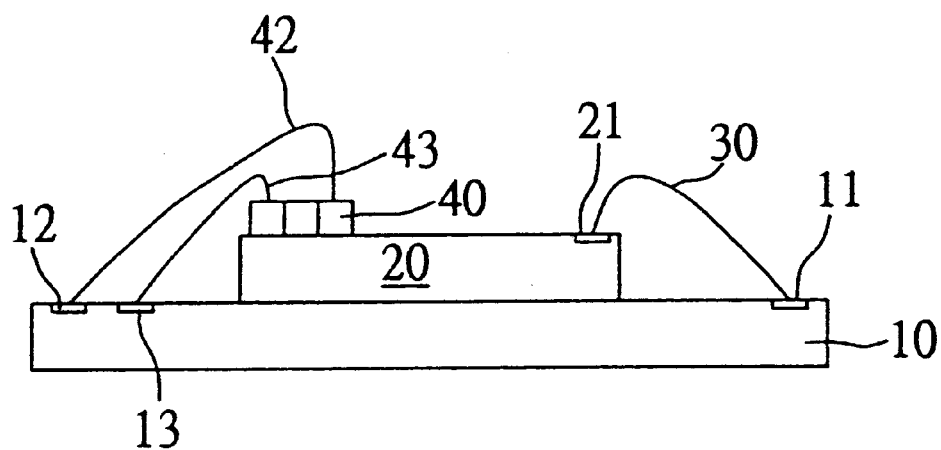
FIG. 12 (PRIOR ART) is a structural schematic diagram showing a further conventional substrate mounted with passive components for use in a semiconductor device.

Alternatively, as shown in FIGS. 8A and 8B, the above first substrate 50 with the electronic component 41 being carried thereon can be mounted on the first surface 14' of the second substrate 10'; this significantly reduces overall height of the semiconductor device of the invention. In this embodiment, plural sets of bonding wires 30, 35, 36 are respectively formed to establish electrical connection among the first surface 22 of the semiconductor chip 20, the first surface 14' of the second substrate 10', and the first surface 56 of the first substrate 50, whereby the semiconductor chip 20, the second substrate 10' and the first substrate 50 (the electronic component 41) can be electrically coupled to each other.

Figure 6A:
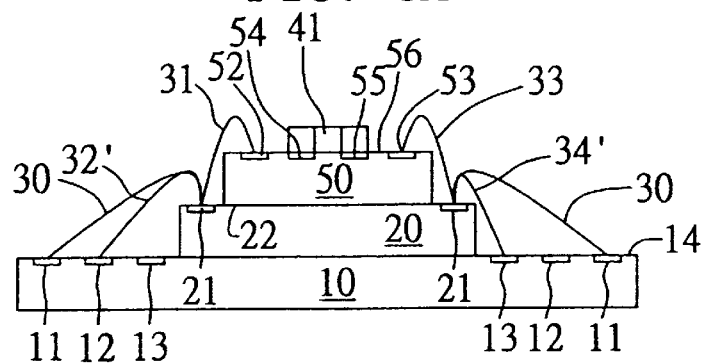
FIGS. 6A and 6B are schematic diagrams showing other preferred embodiments for forming bonding wires of the invention.

In addition, wire connection among the first substrate 50, the semiconductor chip 20 and the second substrate 10 can be alternatively made in a manner shown in FIG. 6A, wherein the bonding wires 32, 34 of FIG. 5 are replaced by bonding wires 32', 34', respectively. As shown in the drawing, the bonding wires 32' electrically connect the power pads of the bond pads 21 formed on the first surface 22 of the semiconductor chip 20, to the power ring 12 formed on the first surface 14 of the second substrate 10. And, the bonding wires 34' electrically connect the ground pads of the bond pads 21 on the first surface 22 of the semiconductor chip 20, to the ground ring 13 on the first surface 14 of the second substrate 10.

Figure 6B:
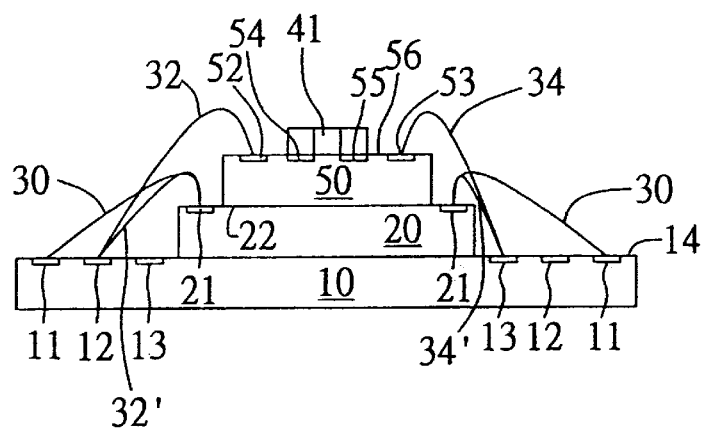

Moreover, a further embodiment of wire connection established among the first substrate 50, the semiconductor chip 20 and the second substrate 10 is illustrated in FIG. 6B, which is accomplished by replacing the bonding wires 31, 33 of FIG. 5 with the bonding wires 32', 34' shown in FIG. 6A, so as to achieve desirable electrical connection for internal elements in the semiconductor device of the invention.

It should be understood that, the foregoing embodiments illustrated in FIGS. 8A and 8B can also alternatively adopt the arrangement of wire connection in FIG. 6A or 6B. Further description thereof is not to be detailed herein.

Figure 7:
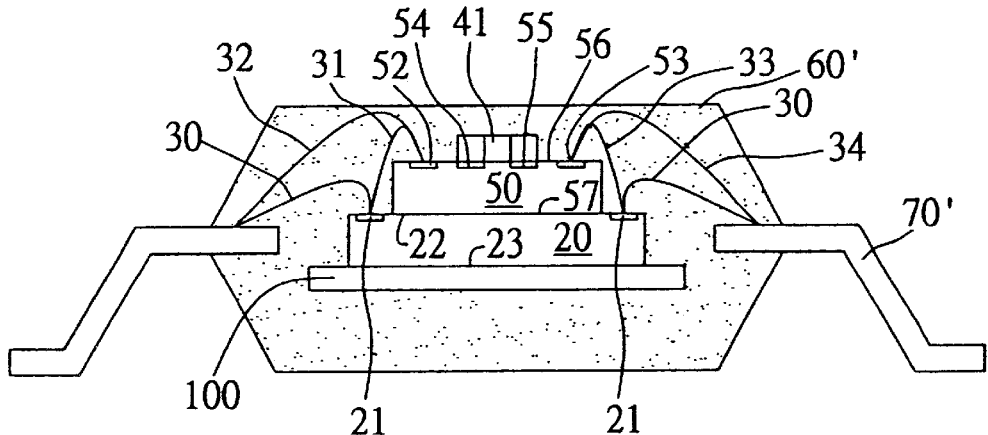
FIG. 7 is a schematic diagram showing another preferred embodiment of a semiconductor device of the invention.

Furthermore, the invention is also suitably applied to a leadframe-based semiconductor device, as shown in FIG. 7, in which the first substrate 50 accommodating the electronic component 41 is positioned in a manner as to attach its second surface 57 to the first surface 22 of the semiconductor chip 20, and the second surface 23 of the semiconductor chip 20 is adhered onto a die pad 100. The plural sets of bonding wires 30, 31, 32, 33, 34 are respectively formed to establish electrical connection among the first surface 22 of the semiconductor chip 20, the first surface 56 of the first substrate 50, and inner portions of a plurality of leads 70' formed around the semiconductor chip 20. A protective encapsulant 60' encapsulates the electronic component 41, the first substrate 50, the semiconductor chip 20, the die pad 100, the bonding wires 30, 31, 32, 33, 34, and the inner portions of the plurality of leads 70'. Alternatively, wire connection in this embodiment can be adapted in a manner illustrated in FIG. 6A or 6B, which also allows desirable electrical connection to be equivalently achieved.

Referring to FIG. 5, a fabrication method of the semiconductor device of the invention comprises the following steps.

First, a first substrate 50 having a first surface 56 and an opposing second surface 57 is prepared, as shown in FIGS.

1A and 1B. The first surface 56 of the first substrate 50 is formed thereon with a plurality of power fingers 52, ground fingers 53, power bond pads 54 and ground bond pads 55, wherein the power fingers 52 and the ground fingers 53 are respectively paired up in parallel connection, and electrically coupled to the power bond pads 54 and the ground bond pads 55.

Figure 1A:
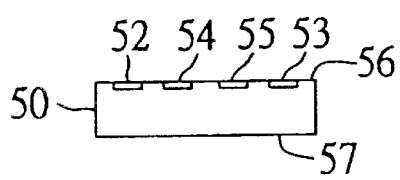
FIGS. 1A and 1B are respectively a front view and a top view of a first substrate used in the invention.
Figure 2A:
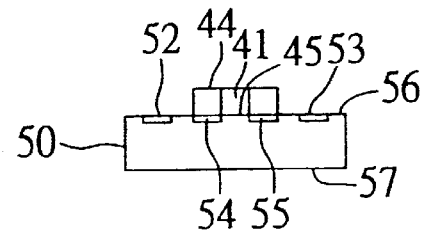
FIGS. 2A and 2B are respectively a front view and a top view showing electronic components mounted on a first substrate of the invention.
Figure 1B:
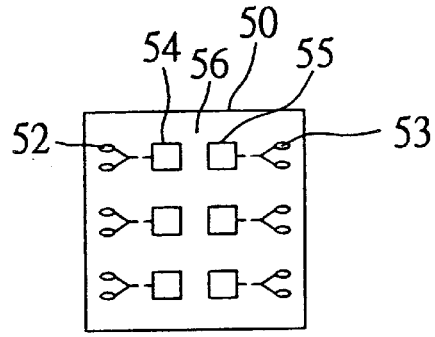
Figure 2B:
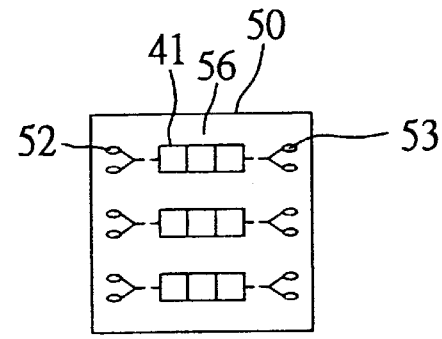

Next, a plurality of electronic components 41 have second surfaces 45 thereof being bonded onto the first surface 56 of the first substrate 50 by using conventional technique such as reflow soldering, as shown in FIGS. 2A and 2B, so as to allow the electronic components 41 to be electrically connected to the power bond pads 54 and the ground bond pads 55 formed on the first substrate 50. The electronic components 41 can be, for example, passive components such as resistors or capacitors.

Figure 3A:
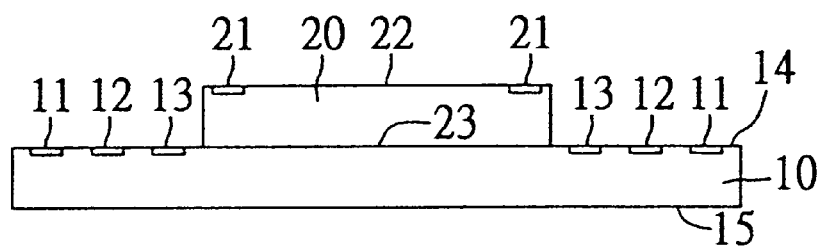
FIGS. 3A and 3B are respectively a front view and a top view showing a semiconductor chip mounted on a second substrate of the invention.
Figure 3B:
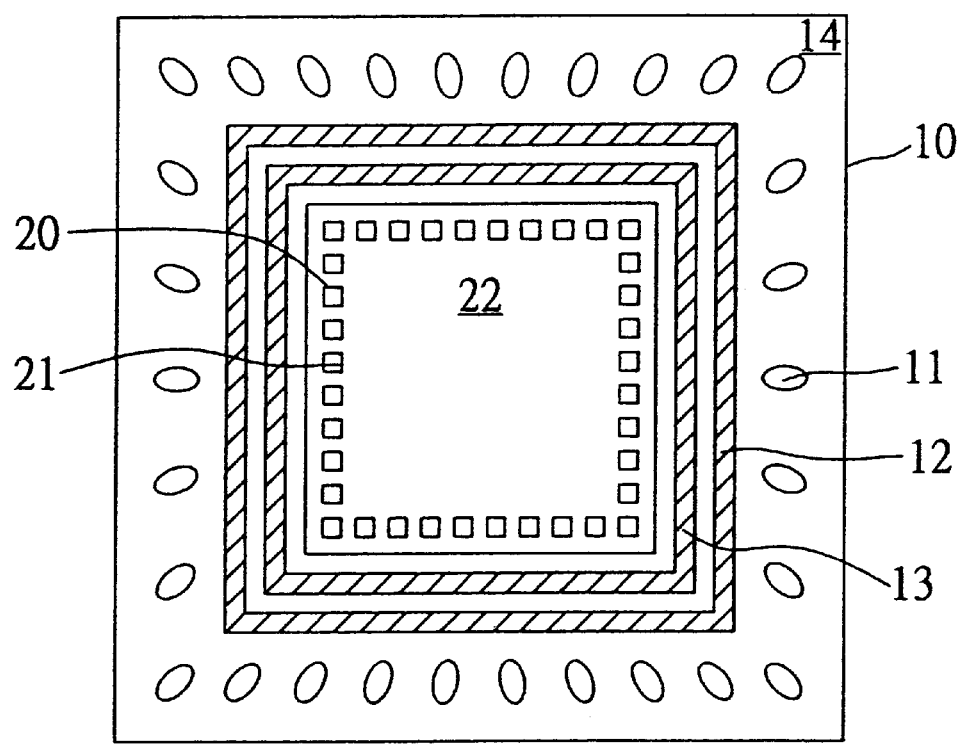

Then, referring to FIGS. 3A and 3B, a semiconductor chip 20 is mounted on a second substrate 10 in a manner that, a second surface 23 of the semiconductor chip 20 is attached to a first surface 14 of the second substrate 10 by conventional means such as adhesion.

Figure 4A:
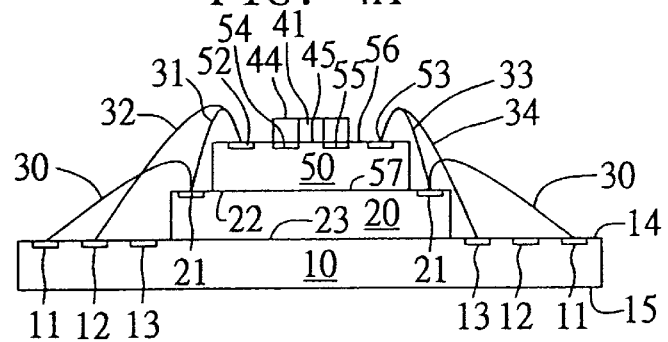
FIGS. 4A and 4B are respectively a front view and a top view showing a first substrate mounted with electronic components and attached onto a semiconductor chip in accompany with the forming of bonding wires of the invention.
Figure 4B:
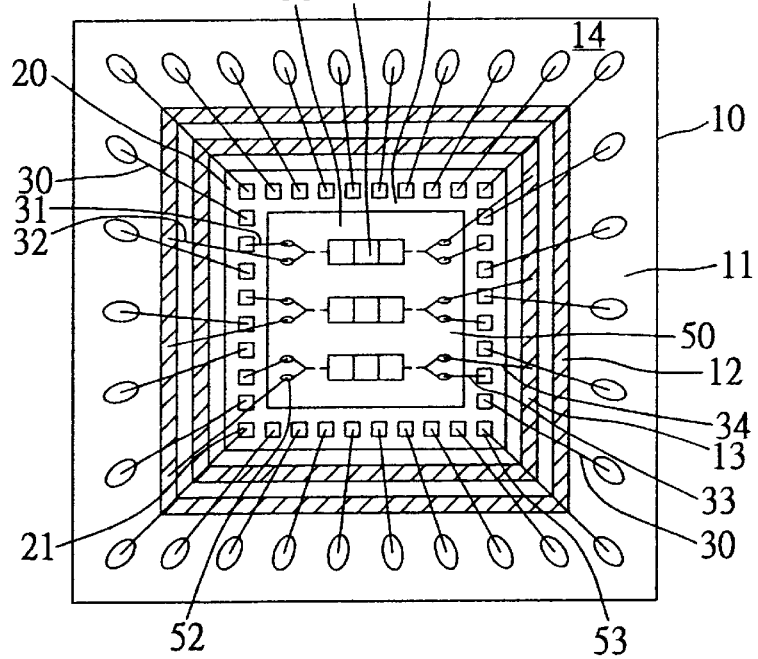

Referring further to FIGS. 4A and 4B, the first substrate 50 carrying the electronic components 41 thereon is mounted on the semiconductor chip 20 by adhering the second surface 57 of the first substrate 50 to a first surface 22 of the semiconductor chip 20. Subsequently, plural sets of electrically-conductive bonding wires 30, 31, 32, 33, 34 such as gold wires are respectively formed to establish electrical connection among the first surface 22 of the semiconductor chip 20, the first surface 56 of the first substrate 50, and the first surface 14 of the second substrate 10. Since detailed wire connection for these bonding wires 30, 31, 32, 33, 34 is previously described in the embodiments of the semiconductor device of the invention, no further depiction thereof is to be recited herein.

Thereafter, referring to FIG. 5, a molding process is performed, in which a protective encapsulant 60 is formed on the first surface 14 of the second substrate 10, for encapsulating the electronic components 41, the first substrate 50, the semiconductor chip 20, and the plurality of bonding wires 30, 31, 32, 33, 34. Finally, a plurality of solder balls 70 are implanted on a second surface 15 of the second substrate 10, allowing the fabricated semiconductor device to be electrically connected to external devices (not shown) by virtue of the solder balls 70.

The semiconductor device fabricated by the above method can alternatively adopt the arrangement of wire connection previously illustrated in FIG. 6A or 6B, which also allows desirable electrical connection to be equivalently accomplished.

Besides, as described above for FIG. 8B, the first substrate 50 with the electronic components 41 being carried thereon can be alternatively mounted on the first surface 14' of the second substrate 10', thereby making the semiconductor device significantly reduced in overall height thereof.

Moreover, the foregoing fabrication method of the invention is also suitably applied for manufacturing a leadframe-based semiconductor device illustrated in FIG. 7, in which two additional steps are required for the fabrication of the leadframe-based semiconductor device, including the mounting of the first substrate 50 carrying the electronic components 41 on the semiconductor chip 20, and the forming of extra bonding wires from the first surface 56 of the first substrate 50. Therefore, no further description thereof is to be detailed herein.

In addition, the foregoing fabrication method of the invention is further suitably applied to batch production of semiconductor devices with the use of matrix-arranged substrates. First, a plurality of matrix-arranged first substrates 50 are made in advance, and then a plurality of electronic components 41 are bonded to the corresponding first substrates 50, respectively. A singulation process is performed afterwards to form individual first substrates 50 with the electronic components 41 being carried thereon. At the same time, a plurality of matrix-arranged second substrates 10 can be similarly prepared, each of which second substrates 10 is mounted with the semiconductor chip 20 and the above singulated first substrate 50. The matrix-arranged second substrates 10 are then subjected to wire bonding, molding, ball implantation and singulation processes to form individually singulated semiconductor devices of the invention.

In conclusion, the foregoing semiconductor device and its fabrication method of the invention provide significant benefits. For example, improvements in performances and functionality of the semiconductor device can be achieved by incorporating electronic components such as passive components of resistors or capacitors therein without further altering the design of substrates or chips, wherein the substrates with the electronic components being carried thereon are simply made through the use of currently available element parts, materials, fabrication processes, technology, and software and hardware equipment. These substrates are much more cost-effectively fabricated than those in the prior arts, and therefore can be widely used for functional enhancement in the semiconductor devices.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a semiconductor device, comprising the steps of:

preparing a first substrate, at least one electronic component, a semiconductor chip and a second substrate, each of which has a first surface and a second surface;

electrically connecting the second surface of the electronic component to the first surface of the first substrate;

attaching the second surface of the semiconductor chip to the first surface of the second substrate;

disposing the second surface of the first substrate associated with the electronic component on combined structure of the semiconductor chip and the second substrate;

forming a plurality of bonding wires for establishing electrical connection among the first surface of the semiconductor chip, the first surface of the first substrate and the first surface of the second substrate;

forming an encapsulant on the first surface of the second substrate, for encapsulating the electronic component, the first substrate, the semiconductor chip and the bonding wires; and implanting a plurality of solder balls on the second surface of the second substrate.

2. The fabrication method of claim 1, wherein the second surface of the first substrate associated with the electronic component is attached to the first surface of the semiconductor chip.

3. The fabrication method of claim 1, wherein the second surface of the first substrate associated with the electronic component is attached to the first surface of the second substrate.

4. The fabrication method of claim 1, wherein the bonding wires include a first set of bonding wires that electrically connect the first surface of the first substrate to the first surface of the semiconductor chip, a second set of bonding wires that electrically connect the first surface of the semiconductor chip to the first surface of the second substrate, and a third set of bonding wires that electrically connect the first surface of the first substrate to the first surface of the second substrate.

5. The fabrication method of claim 1, wherein the bonding wires include a first set of bonding wires that electrically connect the first surface of the first substrate to the first surface of the semiconductor chip, and a second set of bonding wires that electrically connect the first surface of the semiconductor chip to the first surface of the second substrate.

6. The fabrication method of claim 1, wherein the bonding wires include a first set of bonding wires that electrically connect the first surface of the first substrate to the first surface of the second substrate, and a second set of bonding wires that electrically connect the first surface of the semiconductor chip to the first surface of the second substrate.

7. The fabrication method of claim 1, wherein the electronic component is a passive component.

8. The fabrication method of claim 1, wherein the electronic component is reflow-soldered onto the first surface of the first substrate.

* * * * *